(12) United States Patent
Wang et al.

(10) Patent No.: US 12,040,810 B2
(45) Date of Patent: Jul. 16, 2024

(54) TIME-INTERLEAVED SUCCESSIVE APPROXIMATION ANALOG TO DIGITAL CONVERTER AND CALIBRATION METHOD THEREOF

(71) Applicant: ZTE CORPORATION, Shenzhen (CN)

(72) Inventors: Yi Wang, Shenzhen (CN); Hongxing Zhou, Shenzhen (CN); Zhe Zhang, Shenzhen (CN); Zuofeng Zhang, Shenzhen (CN); Dongfang Ning, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 126 days.

(21) Appl. No.: 17/781,521

(22) PCT Filed: Oct. 29, 2020

(86) PCT No.: PCT/CN2020/124982
§ 371 (c)(1),
(2) Date: Jun. 1, 2022

(87) PCT Pub. No.: WO2021/114939
PCT Pub. Date: Jun. 17, 2021

(65) Prior Publication Data
US 2023/0047734 A1    Feb. 16, 2023

(30) Foreign Application Priority Data
Dec. 9, 2019 (CN) .......................... 201911249886.2

(51) Int. Cl.
*H03M 1/10*    (2006.01)
(52) U.S. Cl.
CPC ................................ *H03M 1/1014* (2013.01)

(58) Field of Classification Search
CPC .. H03M 1/468; H03M 1/1215; H03M 1/1245; H03M 1/46; H03M 1/466;
(Continued)

(56) References Cited

U.S. PATENT DOCUMENTS 9,906,234 B2 * 2/2018 de Figueiredo ..... H03M 1/1215
2005/0190089 A1 * 9/2005 Draxelmayr ........ H03M 1/0624
341/123

(Continued)

FOREIGN PATENT DOCUMENTS

CN      108471313 A     8/2018
CN      109361392 A     2/2019
(Continued)

OTHER PUBLICATIONS

Stepanovic, et al. "A 2.8GS/s 44.6 mW Time-Interleaved ADC Achieving 50.9 dB SNDR and 3 dB Effective Resolution Bandwidth of 1.5 GHz in 65 nm CMOS," IEEE Journal of Solid-State Circuits, vol. 48, No. 4, Apr. 2013, pp. 971-982. (Year: 2013).*

(Continued)

*Primary Examiner* — Linh V Nguyen
(74) *Attorney, Agent, or Firm* — Vivacqua Crane, PLLC

(57) ABSTRACT

Provided are a Time-Interleaved Successive Approximation Register Analog-to-Digital Converter, TISAR ADC, and a calibration method thereof. The calibration method for the TISAR ADC may include: sampling an analog signal input into the TISAR ADC to generate a reference digital signal (S130); according to the reference digital signal and output digital signals generated by analog-to-digital conversion sub-modules of the TISAR ADC, obtaining capacitor array calibration parameters and time delay calibration parameters of the analog-to-digital conversion sub-modules; adjusting capacitor arrays of the corresponding analog-to-digital conversion sub-modules according to the capacitor array cali- (Continued)

bration parameters, respectively; and adjusting time delays of the corresponding analog-to-digital conversion sub-modules according to the time delay calibration parameters, respectively.

12 Claims, 9 Drawing Sheets

(58) Field of Classification Search
CPC ...... H03M 1/462; H03M 1/12; H03M 1/1009; H03M 1/38; H03M 1/804; H03M 1/164; H03M 1/0863; H03M 1/1028; H03M 1/121; H03M 1/0695; H03M 1/124; H03M 1/128; H03M 1/145; H03M 1/1019; H03M 3/382; H03M 3/498; H03M 1/0607; H03M 1/1023; H03M 1/002; H03M 1/1071; H03M 1/125; H03M 1/144; H03M 1/44; H03M 1/0678; H03M 1/50; H03M 3/47; H03M 1/123; H03M 1/42; H03M 3/426; H03M 1/0641; H03M 1/1004; H03M 1/1225; H03M 1/04; H03M 1/0656; H03M 1/36; H03M 1/82; H03M 1/0626; H03M 1/122; H03M 3/458; H03M 1/00; H03M 1/06; H03M 1/0609; H03M 1/129; H03M 1/14; H03M 1/167; H03M 1/18; H03M 1/365; H03M 1/78; H03M 3/464; H03M 1/0617; H03M 1/0673; H03M 1/0682
USPC .......................... 341/118–120, 141, 155, 172
See application file for complete search history.

(56) References Cited

U.S. PATENT DOCUMENTS

| | | | | |
|---|---|---|---|---|
| 2007/0262895 A1* | 11/2007 | Stein | .................... | H03M 1/1033 341/155 |
| 2012/0262318 A1* | 10/2012 | Straayer | .............. | H03M 1/1057 341/120 |
| 2013/0002467 A1* | 1/2013 | Wang | .................... | H03M 1/145 341/172 |
| 2013/0076545 A1* | 3/2013 | Sugimoto | ........... | H03M 1/0836 714/704 |
| 2013/0106632 A1* | 5/2013 | Petigny | ............... | H03M 1/1004 341/120 |
| 2013/0344400 A1* | 12/2013 | Girguis | ............... | H01M 8/1018 429/401 |
| 2015/0341044 A1* | 11/2015 | Nakamura | .......... | H03M 1/0624 341/118 |
| 2016/0079994 A1* | 3/2016 | Lee | ......................... | H03M 1/46 341/118 |
| 2017/0117914 A1* | 4/2017 | Choi | .................... | H03M 1/1033 |

FOREIGN PATENT DOCUMENTS

| | | |
|---|---|---|
| CN | 109861691 A | 6/2019 |
| WO | 2019098981 A1 | 5/2019 |

OTHER PUBLICATIONS

European Patent Office. Extended European Search Report for EP Application No. 20898826.1, mailed Jan. 3, 2023, pp. 1-8.
Stepanovic, et al. "A 2.8GS/s 44.6 mW Time-Interleaved ADC Achieving 50.9 dB SNDR and 3 dB Effective Resolution Bandwidth of 1.5 GHz in 65 nm CMOS," IEEE Journal of Solid-State Circuits, vol. 48, No. 4, Apr. 2013, pp. 971-982.
International Searching Authority. International Search Report and Written Opinion for PCT Application No. PCT/CN2020/124982 and English translation, mailed Jan. 27, 2021, pp. 1-10.

* cited by examiner

TIME-INTERLEAVED SUCCESSIVE APPROXIMATION ANALOG TO DIGITAL CONVERTER AND CALIBRATION METHOD THEREOF

CROSS-REFERENCE TO RELATED APPLICATION

This application is a national stage filing under 35 U.S.C. § 371 of international application number PCT/CN2020/124982, filed Oct. 29, 2019, which claims priority to Chinese patent application No. 201911249886.2, filed Dec. 9, 2019. The contents of these applications are incorporated herein by reference in their entirety.

TECHNICAL FIELD

The present disclosure relates the field of signal processing and communication, and in particular to a calibration method for a time-interleaved successive approximation register analog-to-digital converter, and a time-interleaved successive approximation register analog-to-digital converter.

BACKGROUND

In the modern communication field, the RF sampling receiver can directly digitize the received signal and then process the signal in the digital domain, with the advantages of low cost, low power consumption and good performance. The RF sampling receiver mainly converts the received analog signal into a digital signal through an analog-to-digital converter (ADC). Compared with Pipelined ADCs, Successive Approximation Register ADCs (SAR ADCs) further reduces the power consumption and thus has attracted much attention recently.

However, due to successive approximation and other reasons, the rate of SAR ADCs is difficult to increase. In a time-interleaved SAR ADC, a plurality of SAR ADCs operate simultaneously and alternately output the results of conversion, so that the conversion rate of the system is multiplied without increasing the design difficulty, and an effective solution is provided to overcome the bottleneck that the rate of SAR ADCs is difficult to increase.

However, the time-interleaved SAR ADC will lead to nonlinearity due to the capacitance errors of the SAR ADCs and lead to stray due to time errors, so the conversion accuracy of the time-interleaved SAR ADC is restricted and the requirements for high speed and high accuracy in wireless communication cannot be satisfied.

Therefore, how to solve the stray and nonlinearity caused by mismatch and capacitor array errors of the SAR ADCs in the time-interleaved SAR ADC and improve the accuracy of conversion has become a technical problem to be urgently solved in the existing technology.

SUMMARY

In order to at least solve at least one aspect of the above problem to a certain extent, the present disclosure provides a calibration method for a time-interleaved successive approximation register analog-to-digital convertor, and a time-interleaved successive approximation register analog-to-digital convertor.

According to an aspect of the present disclosure, a calibration method for a time-interleaved successive approximation register analog-to-digital converter (TISAR ADC) is provided. The method includes: sampling an analog signal input into the TISAR ADC to generate a reference digital signal; according to the reference digital signal and output digital signals generated by analog-to-digital conversion sub-modules of the TISAR ADC, obtaining capacitor array calibration parameters of the analog-to-digital conversion sub-modules and time delay calibration parameters of the analog-to-digital conversion sub-modules; adjusting capacitor arrays of the corresponding analog-to-digital conversion sub-modules according to the capacitor array calibration parameters, respectively; and, adjusting time delays of the corresponding analog-to-digital conversion sub-modules according to the time delay calibration parameters, respectively.

According to another aspect of the present disclosure, a time-interleaved successive approximation register analog-to-digital converter (TISAR ADC) is provided. The TISAR ADC includes an analog-to-digital conversion module, a reference analog-to-digital convertor module, a calibration parameter calculation module, a capacitor array error compensation module and a time delay adjustment module. The analog-to-digital conversion module includes a plurality of analog-to-digital conversion sub-modules configured to perform time-interleaved sampling on an analog signal input into the TISAR ADC, each of the analog-to-digital conversion sub-modules is able to generate an output digital signal. The reference analog-to-digital convertor module is configured to sample the analog signal to generate a reference digital signal. The calibration parameter calculation module is configured to obtain, according to the reference digital signal generated by the reference analog-to-digital convertor module and the output digital signals generated by the analog-to-digital conversion sub-modules, capacitor array calibration parameters of the analog-to-digital conversion sub-modules and time delay calibration parameters of the analog-to-digital conversion sub-modules. The capacitor array error compensation module includes a plurality of error compensation sub-modules, the number of the error compensation sub-modules being the same as the number of the analog-to-digital conversion sub-modules, the error compensation sub-modules being in one-to-one correspondence to the analog-to-digital conversion sub-modules, the capacitor array error compensation sub-modules being configured to adjust capacitor arrays of the corresponding analog-to-digital conversion sub-modules according to the capacitor array calibration parameters of the analog-to-digital conversion sub-modules. The time delay adjustment module includes a plurality of analog delay line sub-modules, the number of the analog delay line sub-modules being the same as the number of analog-to-digital conversion sub-modules, the analog delay line sub-modules being in one-to-one correspondence to the analog-to-digital conversion sub-modules, and the analog delay line sub-modules being configured to adjust time delays of the corresponding analog-to-digital conversion sub-modules according to the time delay calibration parameters of the analog-to-digital conversion sub-modules.

BRIEF DESCRIPTION OF DRAWINGS

The accompanying drawings are provided for the further understanding of the present disclosure, and constitute a part of this description. In addition, the accompanying drawings are used together with the following implementations to illustrate the present disclosure and not intended to limit the present disclosure, in which.

DETAILED DESCRIPTION

The implementations of the present disclosure will be described below in detail with reference to the accompanying drawings. It should be understood that the implementations to be described herein are merely intended to describe and illustrate the present disclosure, and do not limit the present disclosure.

It was found through researches that, in some cases, in order to improve the accuracy and performance of a time-interleaved SAR ADC, the adopted schemes are classified into a method for eliminating capacitor array errors of the time-interleaved SAR ADC and a method for eliminating sampling time errors of the time-interleaved SAR ADC. In the above methods, the time interleaving errors and capacitor array errors are calibrated separately, resulting in low convergence speed, high analog design requirement and other deficiencies affecting the dynamic range of the ADC. However, actually, the calibration of time errors will often affect the calibration of capacitor array errors, and the presence of capacitor array errors will also reduce the performance of the time error calibration. In addition, the two errors will vary with PVT, that is, process, voltage and temperature. Therefore, the separate elimination of time interleaving errors or capacitor array errors cannot effectively improve the accuracy and performance of the time-interleaved SAR ADC.

Figure 1:
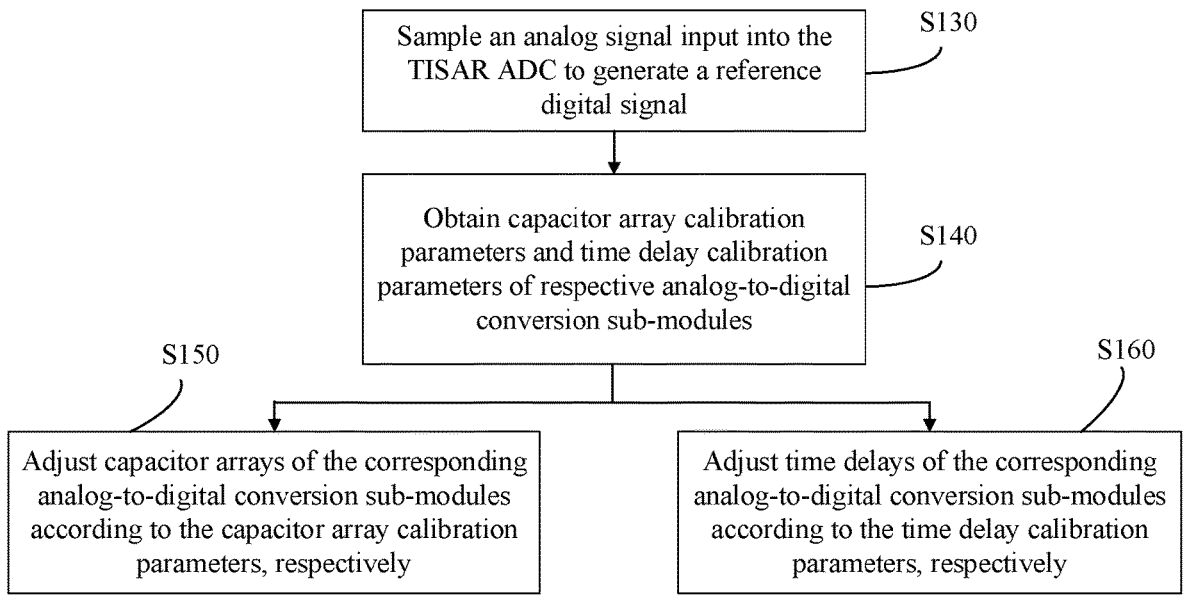
FIG. 1 is a flowchart of an implementation of the calibration method according to the present disclosure.

In view of the above, according to an aspect of the present disclosure, a calibration method for a time-interleaved successive approximation register analog-to-digital converter (TISAR ADC) is provided. As shown in FIG. 1, the calibration method includes steps S130 to S160.

At S130, an analog signal input into the TISAR ADC is sampled to generate a reference digital signal.

At S140, according to the reference digital signal and output digital signals generated by analog-to-digital conversion sub-modules of the TISAR ADC, capacitor array calibration parameters of the analog-to-digital conversion sub-modules and time delay calibration parameters of the analog-to-digital conversion sub-modules are obtained.

At S150, capacitor arrays of the corresponding analog-to-digital conversion sub-modules are adjusted according to the capacitor array calibration parameters, respectively.

At S160, time delays of the corresponding analog-to-digital conversion sub-modules are adjusted according to the time delay calibration parameters, respectively.

It is to be noted that the precedence of S150 and S160 will not be specifically limited in the present disclosure. For example, the S150 may be performed prior to the S160, or the S150 may be performed prior to S160, or S150 and S160 may be performed simultaneously.

In the present disclosure, the analog signal input into the TISAR ADC may the known specific reference signal, and a theoretically ideal result of conversion of the SAR ADC is taken as the reference digital signal, thereby realizing foreground calibration of the TISAR ADC. The analog signal input into the TISAR ADC may also be the signal input into the TISAR ADC during the operation of the TISAR ADC. At this time, the digital signal generated by sampling and quantizing the input signal is used as the reference digital signal, thereby realizing background calibration of the TISAR ADC without interfering with the normal operation of the TISAR ADC.

In the present disclosure, errors of the output digital signals of the analog-to-digital conversion sub-modules are obtained by comparing the reference digital signal with the output digital signals generated by the analog-to-digital conversion sub-modules of the TISAR ADC at S140. By utilizing the errors, the capacitor array calibration parameters of the analog-to-digital conversion sub-modules are calculated for calibrating the capacitor array errors of the TISAR ADC at S150, and the time delay calibration parameters of the analog-to-digital conversion sub-modules are calculated for calibrating the time errors of the TISAR ADC at S160. Accordingly, the capacitor array errors and time errors in the TISAR ADC are jointly calibrated, and the mutual influence of the capacitor array errors and time errors is reduced. In addition, during the calibration of the capacitor array calibration parameters and time delay calibration parameters of the analog-to-digital conversion sub-modules, there is no need to repeatedly calculate the errors of the output digital signals of the analog-to-digital conversion sub-modules, so that the consumption of calculation resources can be decreased and the design requirement for the hardware circuit of the TISAR ADC can be reduced.

In the calibration method for a TISAR ADC according to the present disclosure, the capacitor array errors and time errors in the TISAR ADC are jointly calibrated by utilizing the high-accuracy reference digital signal, so that the mutual influence of capacitor array errors and time errors can be reduced, and the accuracy of calibration of the capacitor array errors and time errors in the TISAR ADC can be improved to further improve the accuracy and performance of the TISAR ADC. Both the reference digital signal and the obtained errors of the output digital signals of the analog-to-digital conversion sub-modules are utilized to calibrate the capacitor array errors and time errors of the TISAR ADC, so that the consumption of calculation resource can be decreased. In addition, the calibration method according to the present disclosure can realize the foreground calibration and background calibration of the TISAR ADC, so that real-time calibration can be realized according to the change in PVT without affecting the operation of the TISAR ADC, and the stability of accuracy and performances of the TISAR ADC can be improved.

Some concepts involved in the calibration method according to the present disclosure will be illustrated with reference to FIG. 7. In the implementation shown in FIG. 7, the TISAR ADC includes two analog-to-digital conversion sub-modules and a reference analog-to-digital convertor. The analog signal $S_{in}$ input into the TISAR ADC is a sine signal. $ADC_1$ clock is a clock signal used for sampling $S_{in}$ by one analog-to-digital conversion sub-module (which is referred to as a first analog-to-digital conversion sub-module for convenience of description). $T_1$ is the period of the $ADC_1$ clock. $ADC_2$ clock is a clock signal used for sampling $S_{in}$ by the other analog-to-digital conversion sub-module (which is referred to as a second analog-to-digital conversion sub-module for convenience of description). $T_2$ is the period of the $ADC_2$ clock. $ADC_{ref}$ clock is a clock signal used for sampling $S_{in}$ by the reference analog-to-digital converter. $T_3$ is the period of the $ADC_{ref}$ clock. In the TISAR ADC, the first analog-to-digital conversion sub-module and the second analog-to-digital conversion sub-module are the same SAR ADCs, so that the first analog-to-digital conversion sub-module and the second analog-to-digital conversion sub-module have the same sampling frequency, that is, $T_1=T_2$.

Figure 7:
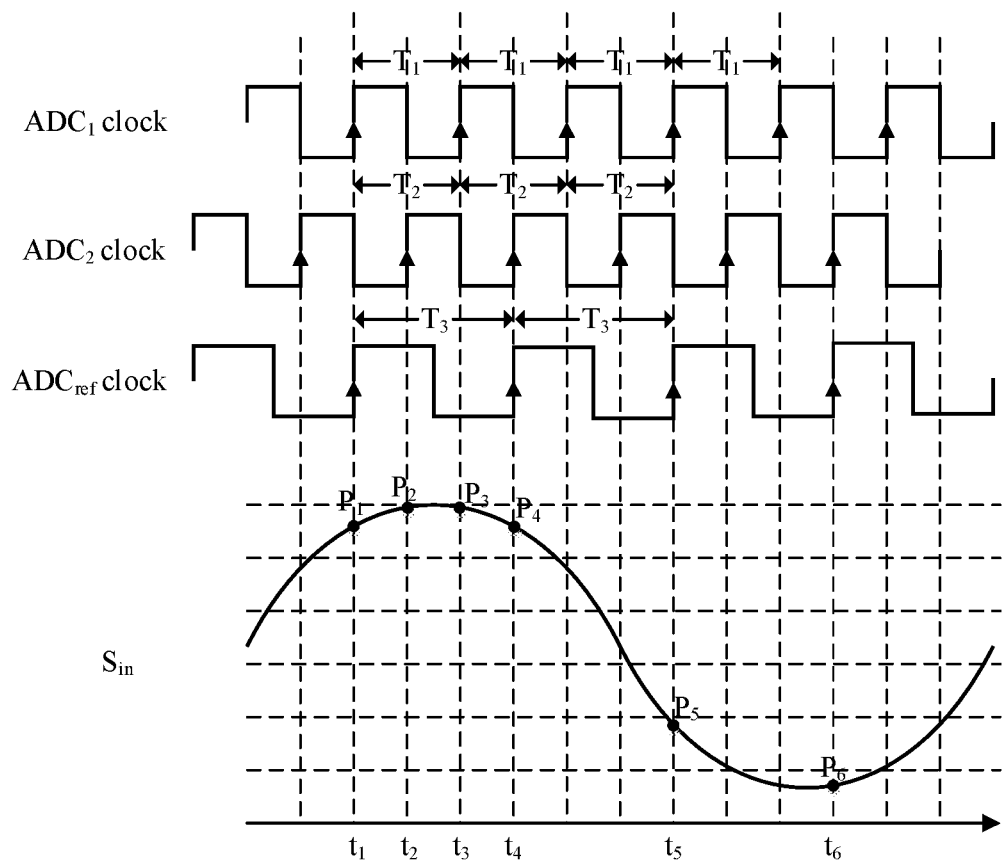
FIG. 7 is a sampling diagram of the calibration method according to the present disclosure.

In the implementation shown in FIG. 7, the analog-to-digital conversion sub-modules and the reference analog-to-digital converter sample the analog signal $S_{in}$ at a rising edge of respective clock signals. For example, at a moment $t_1$, the first analog-to-digital conversion sub-module samples the level of a point $P_1$ of $S_{in}$ at the rising edge of the clock signal $ADC_1$ clock, and a generated output digital signal is the output digital signal of the TISAR ADC at the moment $t_1$. At a moment $t_2$, the second analog-to-digital conversion sub-module samples the level of a point $P_2$ of $S_{in}$ at the rising edge of the clock signal $ADC_2$ clock, and a generated output digital signal is the output digital signal of the TISAR ADC at the moment $t_2$. It can be seen that, instead of simultaneously sampling $S_{in}$ to generate the output digital signals, the first analog-to-digital conversion sub-module and the second analog-to-digital conversion sub-module sample $S_{in}$ in a time-interleaved manner to generate the output digital signals of the TISAR ADC, where each analog-to-digital conversion module adopts the period of respective clock signals as a sampling period to periodically sample the analog signal $S_{in}$. In addition, the reference analog-to-digital converter also adopts the period of the $ADC_{ref}$ clock as a sampling period to periodically sample $S_{in}$, so as to generate the reference digital signal.

In the present disclosure, the sampling moment refers to the moment when the analog-to-digital conversion sub-module samples the input analog signal to generate the output digital signal. For example, $t_1$ is the sampling moment of the output digital signal of the first analog-to-digital conversion sub-module at the moment $t_1$, and $t_2$ is the sampling moment of the output digital signal of the second analog-to-digital conversion sub-module at the moment $t_2$. Each analog-to-digital conversion sub-module corresponds to a plurality of sampling moments.

Figure 2:
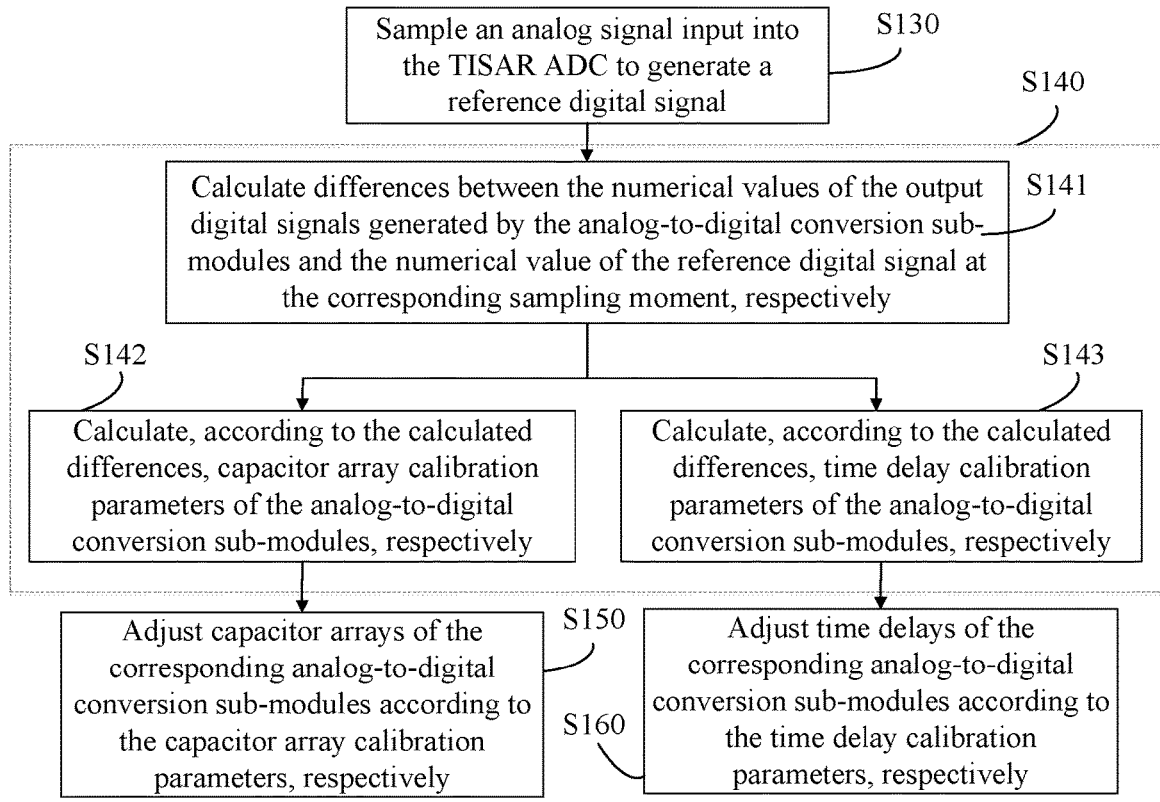
FIG. 2 is a flowchart of another implementation of the calibration method according to the present disclosure.

As an implementation of the present disclosure, the errors of the output digital signals of the analog-to-digital conversion sub-modules are obtained by calculating a difference between the numerical values of the output digital signals generated by the analog-to-digital conversion sub-modules and the numerical value of the reference digital signal at the corresponding moment; and, the capacitor array calibration parameters of the analog-to-digital conversion sub-modules and the time delay calibration parameters of the analog-to-digital conversion sub-modules at S140 are obtained according to the differences. Correspondingly, as shown in FIG. 2, the S140 includes steps S141 to S143.

At S141, differences between the numerical values of the output digital signals generated by the analog-to-digital conversion sub-modules and the numerical value of the reference digital signal at the corresponding sampling moment are calculated, respectively.

At S142, capacitor array calibration parameters of the analog-to-digital conversion sub-modules are calculated according to the calculated differences, respectively.

At S143, time delay calibration parameters of the analog-to-digital conversion sub-modules are calculated according to the calculated differences, respectively.

By taking FIG. 7 as an example, the analog-to-digital conversion sub-modules are the first analog-to-digital conversion sub-module and the second analog-to-digital conversion sub-module described above, respectively.

As shown in FIG. 7, at the moment $t_1$, the first analog-to-digital conversion sub-module samples the level of the point $P_1$ of $S_{in}$ at the rising edge of the clock signal $ADC_1$ clock to generate an output digital signal, and the reference analog-to-digital converter samples the level of the point $P_1$ of $S_{in}$ at the rising edge of the clock signal $ADC_{ref}$ clock to generate a reference digital signal. At a moment $t_4$, the second analog-to-digital conversion sub-module samples the level of a point $P_4$ of $S_{in}$ at the rising edge of the clock signal $ADC_2$ clock to generate an output digital signal, and the reference analog-to-digital converter samples the level of the point $P_4$ of $S_{in}$ at the rising edge of the clock signal $ADC_{ref}$ clock to generate a reference digital signal. At a moment $t_5$, the first analog-to-digital conversion sub-module samples the level of a point $P_5$ of $S_{in}$ at the rising edge of the clock signal $ADC_1$ clock to generate an output digital signal, and the reference analog-to-digital converter samples the level of the point $P_5$ of $S_{in}$ at the rising edge of the clock signal $ADC_{ref}$ clock to generate a reference digital signal. At a moment $t_6$, the second analog-to-digital conversion sub-module samples the level of a point $P_6$ of $S_{in}$ at the rising edge of the clock signal $ADC_2$ clock to generate an output digital signal, and the reference analog-to-digital converter samples the level of the point $P_6$ of $S_{in}$ at the rising edge of the clock signal $ADC_{ref}$ clock to generate a reference digital signal. It can be seen that, at different moments, when the reference analog-to-digital converter samples $S_{in}$ to generate the reference digital signal, the analog-to-digital conversion modules that sample $S_{in}$ to generate the output digital signals may be different.

It is to be noted that, at some moments, the analog-to-digital conversion sub-modules sample the input signal, but the reference analog-to-digital converter does not sample the input signal. For example, in FIG. 7, at the moment $t_2$, the second analog-to-digital conversion sub-module samples the level of the point $P_2$ of $S_{in}$ at the rising edge of the clock signal $ADC_2$ clock to generate an output digital signal; and, at a moment $t_3$, the first analog-to-digital conversion sub-module samples the level of a point $P_3$ of $S_{in}$ at the rising edge of the clock signal $ADC_2$ to generate an output digital signal. However, since the $ADC_{ref}$ clock has no rising edge at moments $t_2$ and $t_3$, the reference analog-to-digital converter does not sample the $S_{in}$.

In the present disclosure, in the TISAR ADC, the errors of the output digital signals of the analog-to-digital conversion sub-modules are obtained by comparing the output digital signals of the analog-to-digital conversion sub-modules with the reference digital signals, and then the analog-to-digital conversion sub-modules are calibrated, respectively. However, in the TISAR ADC, the analog-to-digital conversion sub-modules sample $S_{in}$ in a time-interleaved manner to generate the output digital signals instead of simultaneously.

Therefore, at the step 141, by taking the first analog-to-digital conversion sub-module as an example, in order to obtain the error of the output digital signal of the first analog-to-digital conversion sub-module relative to the reference digital signal, it is necessary to calculate the difference between the numerical value of the output digital signal generated by the first analog-to-digital conversion sub-module and the numerical value of the reference digital signal generated by the reference analog-to-digital converter at the moment when the first analog-to-digital conversion sub-module and the reference analog-to-digital converter simultaneously sample $S_{in}$. More specifically, as shown in FIG. 7, at the sampling moment $t_1$, the first analog-to-digital conversion sub-module and the reference analog-to-digital converter simultaneously sample $S_{in}$. At S141, a first difference between the numerical value of the output digital signal generated by the first analog-to-digital conversion sub-module and the numerical value of the reference digital signal generated by the reference analog-to-digital converter at the sampling moment $t_1$ is calculated. A S142, the capacitor array calibration parameter of the first analog-to-digital conversion sub-module is calculated according to the first difference. At S143, the time delay calibration parameter of the first analog-to-digital conversion sub-module is calculated according to the first difference. At the sampling moment $t_4$, the second analog-to-digital conversion sub-module and the reference analog-to-digital converter simultaneously sample $S_{in}$. At S141, a second difference between the numerical value of the output digital signal generated by the second analog-to-digital conversion sub-module and the numerical value of the reference digital signal generated by the reference analog-to-digital converter at the sampling moment $t_4$ is calculated. At S142, the capacitor array calibration parameter of the second analog-to-digital conversion sub-module is calculated according to the second difference. At S143, the time delay calibration parameter of the second analog-to-digital conversion sub-module is calculated according to the second difference.

Figure 3:
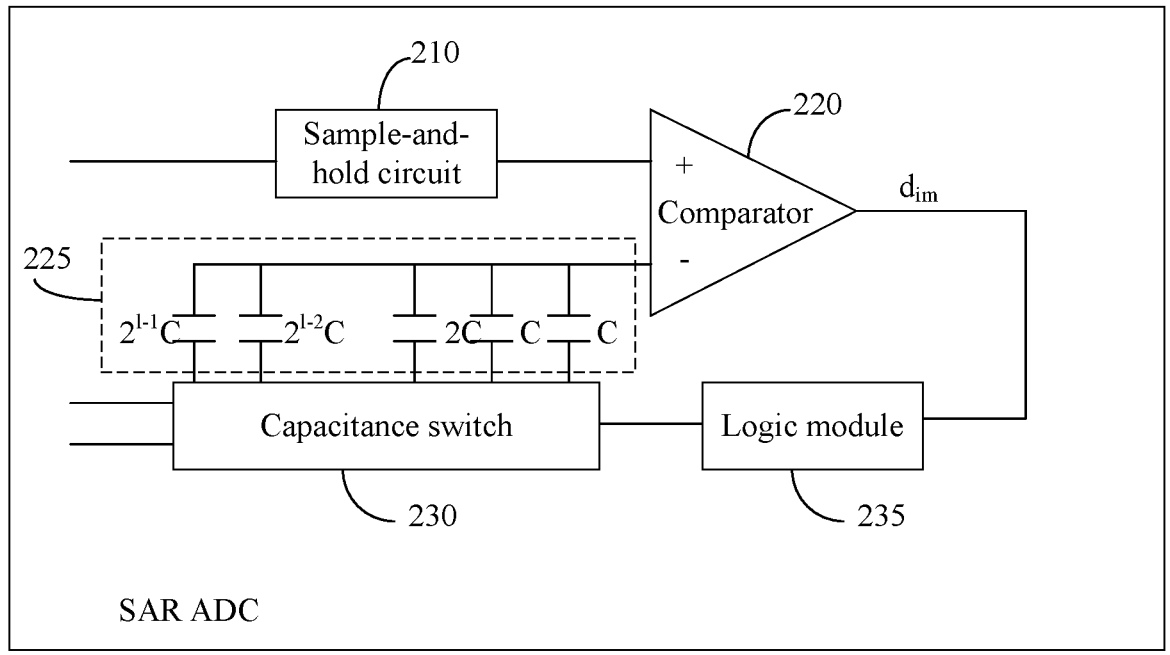
FIG. 3 is a schematic structural diagram of an SAR ADC.

In the present disclosure, the analog-to-digital conversion sub-modules are consisted of SAR ASCs, and the calibration of the capacitor array errors of the TISAR ADC is mainly performed in the digital domain. FIG. 3 is a structural diagram of an SAR ADC. The input signal is input into a comparator 220 after passing through a sample-and-hold circuit 210 and is compared with a voltage value of a capacitor array 225 to output a digital code element. The output digital code element controls a capacitance switch 230 through a logical module 235, so as to change the voltage value of the capacitor array 225. Each sub-capacitance $C_i$ in the capacitor array 225 is successively compared with the input signal to obtain a digital code element output $d_i$. In the capacitor array of the SAR ADC, if the sub-capacitance $C_i$ has a weight of $\hat{W}_i$, the digital output of the SAR ADC after weight conversion is shown by the following formula (1):

$$ADC = \sum_{i=1}^{I} \hat{W}_i d_i. \quad (1)$$

Figure 4:
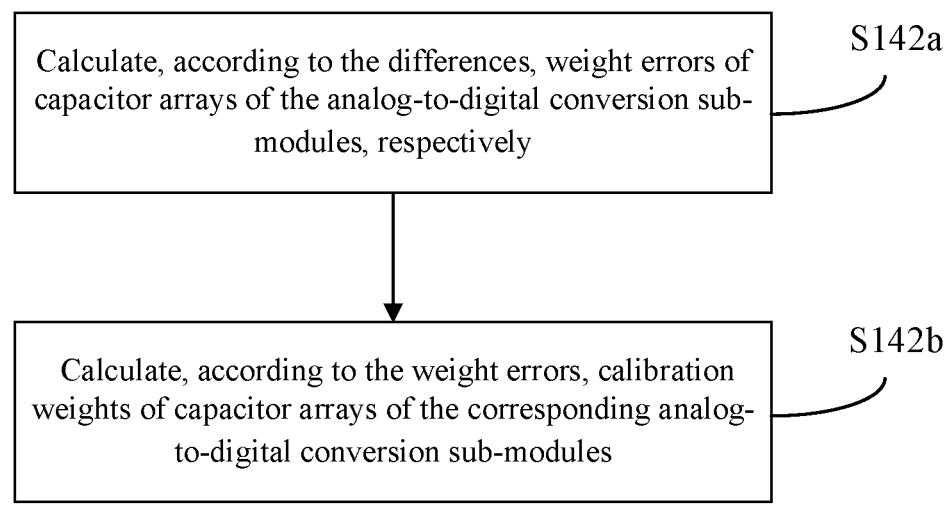
FIG. 4 is a flowchart of still another implementation of the calibration method according to the present disclosure.

Since the capacitance actually cannot be free from deviation and the capacitance will change with the change in temperature and the like, the weight of each sub-capacitance $C_i$ in the capacitor array 225 of the SAR ADC will have a deviation, leading to a capacitor array error of the TISAR ADC. Therefore, in the present disclosure, weight errors of capacitor arrays of the analog-to-digital conversion sub-modules are calculated according to the differences, respectively, and calibration weights of the capacitor arrays of the corresponding analog-to-digital conversion sub-modules are calculated as the capacitor array calibration parameters according to the weight errors, so that the weight of each sub-capacitance $C_i$ in the capacitor array 225 of each analog-to-digital conversion sub-module can be calibrated to be approximate to a theoretical value as far as possible. Thus, the capacitor array errors of the analog-to-digital conversion sub-modules can be calibrated to realize further calibration of the capacitor array errors of the TISAR ADC. Correspondingly, as shown in FIG. 4, S142 includes steps S142a to S142b.

At S142a, weight errors of capacitor arrays of the analog-to-digital conversion sub-modules are calculated according to the differences, respectively.

At S142b, calibration weights of capacitor arrays of the corresponding analog-to-digital conversion sub-modules are calculated according to the weight errors, and the calibration weights are used as capacitor array calibration parameters of the analog-to-digital conversion sub-modules.

Figure 5:
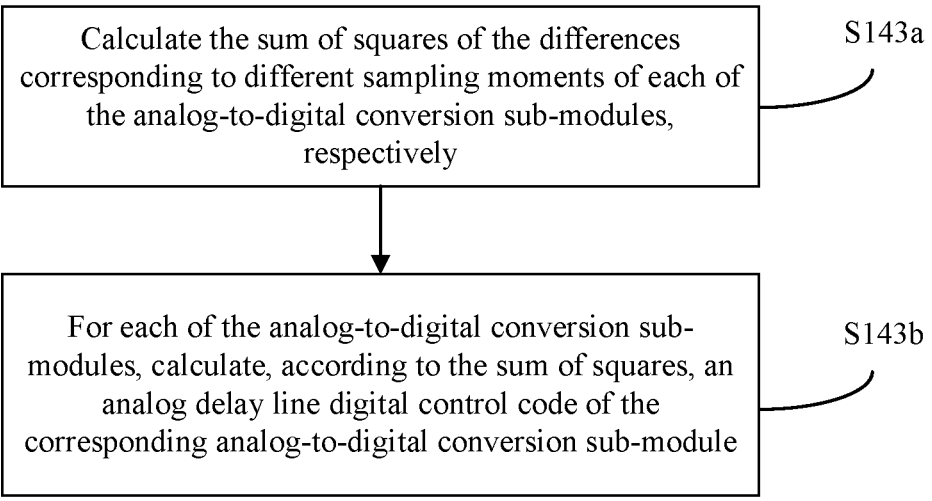
FIG. 5 is a flowchart of yet another implementation of the calibration method according to the present disclosure.

In the present disclosure, the calibration of time errors in the TISAR ADC is mainly performed in the analog domain. In an embodiment, by adjusting analog delay lines of the analog-to-digital conversion sub-modules of the TISAR ADC, the time errors of the analog-to-digital conversion sub-modules are compensated, so as to compensate the time errors of the TISAR ADC. In addition, it was found through researches that the squares of the differences between the numerical values of the output digital signals of the TISAR ADC and the numerical value of the reference digital signal are positively related to the size of the time errors of the TISAR ADC. Therefore, in the present disclosure, as shown in FIG. 5, S143 further includes steps S143a to S143b.

At S143a, the sum of squares of the differences corresponding to different sampling moments of each of the analog-to-digital conversion sub-modules is calculated, respectively.

At S143b, for each of the analog-to-digital conversion sub-modules, an analog delay line digital control code of the corresponding analog-to-digital conversion sub-module is calculated according to the sum of squares, and the analog delay line digital control code is used as the time delay calibration parameter of the analog-to-digital conversion sub-module.

It is to be noted that, at different moments, when the reference analog-to-digital converter samples $S_{in}$ to generate the reference digital signal, the analog-to-digital conversion sub-modules that sample $S_{in}$ to generate the output digital signals may be different. However, when a larger number of reference digital signals are sampled to calculate the differences at S141, there may be a plurality of differences which correspond to different sampling moments of the same analog-to-digital conversion sub-module. At S143a, square summation is performed on the plurality of differences to obtain the sum of squares. For example, as shown in FIG. 7, at moments $t_1$ and $t_5$, the differences calculated at S141 correspond to the first analog-to-digital conversion sub-module; and, at moments $t_4$ and $t_6$, the differences calculated at S141 correspond to the second analog-to-digital conversion sub-module.

The present disclosure provides an embodiment of obtaining capacitor array calibration parameters of the analog-to-digital conversion sub-modules and time delay calibration parameters of the analog-to-digital conversion sub-modules according to the reference digital signal and the output digital signals generated by the analog-to-digital conversion sub-modules of the TISAR ADC.

Figure 6:
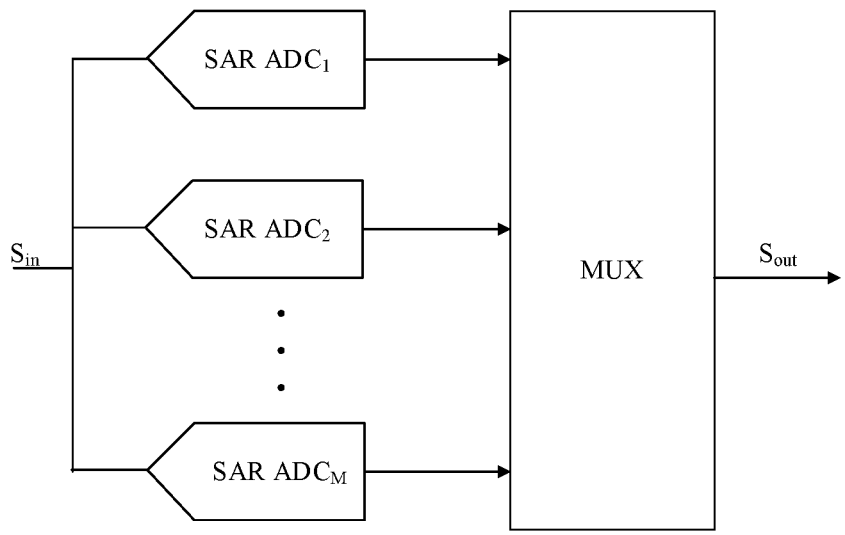
FIG. 6 is a schematic structural diagram of a conventional TISAR ADC.

As shown in FIG. 6, in a conventional TISAR ADC, an analog signal $S_{in}$ is sampled by a plurality of SAR ADCs in a time-interleaved manner, and a sampling output $S_{out}$ of a high-speed ADC having a sampling frequency of $f_s$ is obtained by a multiplexer MUX. When the TISAR ADC contains M SAR ADCs, the sampling frequency of each SAR ADC is $f_s/M$.

In the present disclosure, when the analog signal input into the TISAR ADC is sampled to generate a reference digital signal, the sampling frequency may be $f_s/N$. The N and M have a co-prime relationship. It is to be noted that, as shown in FIG. 7, N and M are set as co-prime natural numbers, so that each SAR ADC in the TISAR ADC has a reference digital signal corresponding to the output signal of the SAR ADC every certain time. For example, at moments $t_1$ and $t_5$, the reference digital signal corresponds to the first analog-to-digital conversion sub-module; and, at moments $t_4$ and $t_6$, the reference digital signal corresponds to the second analog-to-digital conversion sub-module, so that the plurality of sub-SAR ADCs in the TISAR ADC are calibrated by one reference ADC.

In the present disclosure, based on the principle of statistics, the output digital signals of the SAR ADCs and the reference digital signal are sampled to obtain a plurality of samples. Since the analog-to-digital conversion sub-modules in the TISAR ADC sample the input signal in a time-interleaved manner to generate the output digital signals of the TISAR ADC, in order to calculate the difference between the numerical value of the output digital signal generated by each SAR ADC and the numerical value of the reference digital signal at the corresponding moment, the numerical value of each SAR ADC at each moment need to be associated with the numerical value of the reference digital signal at the corresponding component.

In an embodiment, the reference digital signal may be associated with the output digital signal generated by each analog-to-digital conversion sub-module in the following way.

If it is assumed that $ADC_1[k]$ and $ADC_2[k]$ are the outputs of a first SAR ADC and a second SAR ADC in the TISAR ADC at a $k^{th}$ moment, respectively, and $ADC_{ref}[k]$ is the output of a reference channel ADC at the $k^{th}$ moment, the correspondences between $ADC_1[k]$ and $ADC_{ref}[k]$, and between $ADC_2[k]$ and $ADC_{ref}[k]$ are shown by the following formulae (2) and (3):

$$ADC_{ref}[2k] \rightarrow ADC_1[3k] \, k=0,1,2,\ldots \quad (2)$$

$$ADC_{ref}[2k+1] \rightarrow ADC_2[3k+1] \, k=0,1,2,\ldots \quad (3).$$

Generally, the correspondence between the output of an $m^{th}$ SAR ADC at the $k^{th}$ moment and the reference digital signal may be represented by the following formula (4):

$$ADC_{ref}[2k] \rightarrow ADC_m[3k+m-1] \, k=0,1,2,\ldots \quad (4).$$

For the $m^{th}$ SAR ADC, if it is assumed that $\hat{W}_{im}$ is an actual weight of a capacitance $C_{im}$ in the capacitor array of the SAR ADC and $W_{im}$ is a corresponding theoretical weight, a derivation $\varepsilon_{im}$ between the actual weight and the theoretical weight is shown by the following formula (5):

$$\hat{W}_m = W_{im} + \varepsilon_{im} \quad (5).$$

It can be known from the formula (1) that a digital output of the $m^{th}$ SAR ADC after weight conversion may be represented by the following formula (6):

$$ADC_m = \sum_{i=1}^{I} W_{im} d_{im} + \sum_{i=1}^{I} \varepsilon_{im} d_{im}. \quad (6)$$

The difference between the output digital signal of the $m^{th}$ SAR ADC and the reference digital signal is represented by the following formula (7):

$$e_m = ADC_m - ADC_{ref} \quad (7).$$

The following formula (8) can be further converted from the formula (6):

$$e_m \approx \sum_{i=1}^{I} \varepsilon_{im} d_{im}. \quad (8)$$

Assuming that the number of samples obtained after associating the numerical value of the output digital signal of the $m^{th}$ SAR ADC at each moment and the numerical value of the reference digital signal at the corresponding moment is K, an optimal estimated value of the capacitor array weight error of the $m^{th}$ SAR ADC may be calculated by the cost function in formula (9):

$$\min \sum_{k=1}^{K} \left\| e_{mk} - \sum_{i=1}^{I} \varepsilon_{im} d_{im,k} \right\|. \quad (9)$$

According to the last square criterion, an estimated value of the capacitor array weight error of the $m^{th}$ SAR ADC can be obtained, as shown by the following formula (10):

$$\varepsilon_m = \text{pinv}(D_m) * e_m \quad (10)$$

where $\varepsilon_m = [\varepsilon_{1m}, \varepsilon_{2m}, \varepsilon_{3m}, \ldots, \varepsilon_{Dm}]^T$, and $D_m$ is a matrix formed by code elements of K samples output by the SAR ADC. The $D_m$ may be represented by the following formula (11):

$$D_m = \begin{bmatrix} d_{m(1,1)} & \cdots & d_{m(1,K)} \\ \vdots & \ddots & \vdots \\ d_{m(I,1)} & \cdots & d_{m(I,K)} \end{bmatrix} \quad (11)$$

where $e_m = [e_1, e_2, \ldots, e_K]^T$ is a difference between the output digital signal of the $m^{th}$ SAR ADC and the numerical value of the reference digital signal at the same moment.

In the present disclosure, the error of the capacitor array is calculated iteratively, and the calibration weight of the capacitor array of the analog-to-digital conversion sub-modules may be represented by the following formula (12):

$$\hat{W}_m[n] = \hat{W}_m[n-1] + u_I \varepsilon_m \quad (12)$$

where $\hat{W}_m[n] = [\hat{W}_{1m}[n], \hat{W}_{2m}[n], \ldots, \hat{W}_{Im}[n]]^T$ is a vector formed by the capacitance weight value of the $m^{th}$ SAR ADC at a current moment, and $u_I$ is a step factor used to control the convergence rate of the algorithm and can be set according to actual needs.

In the present disclosure, the time error is calibrated iteratively.

The sum of squares of the differences between the numerical values of the output digital signals of the $m^{th}$ SAR ADC at different moments and the numerical value of the reference digital signal at the corresponding component may be represented by the following formula (13):

$$J_m[n] = \sum_{k=1}^{K} e_{mk}^2 \qquad (13)$$

where K is the number of samples to be accumulated in one iteration.

$J'_m$ is obtained by utilizing $J_m$ of the current iteration and a previous iteration, so that a direction and step of digital code element iterations can be determined, as shown by the following formula (14):

$$J'_m[n] = \frac{J_m[n]}{\text{sign}(J_m[n-1] - J_m[n])}. \qquad (14)$$

Further, the following formula (15) can be obtained:

$$D_{m,n} = D_{m,n-1} + u_2 J'_m \qquad (15)$$

where $D_{m,n}$ and $D_{m,n-1}$ denote the digital control codes of the analog delay lines of the $m^{th}$ SAR ADC at the current moment and a previous moment, respectively, and $u_2$ is a step factor used to control the convergence rate of the algorithm and can be set according to actual needs.

Figure 8:
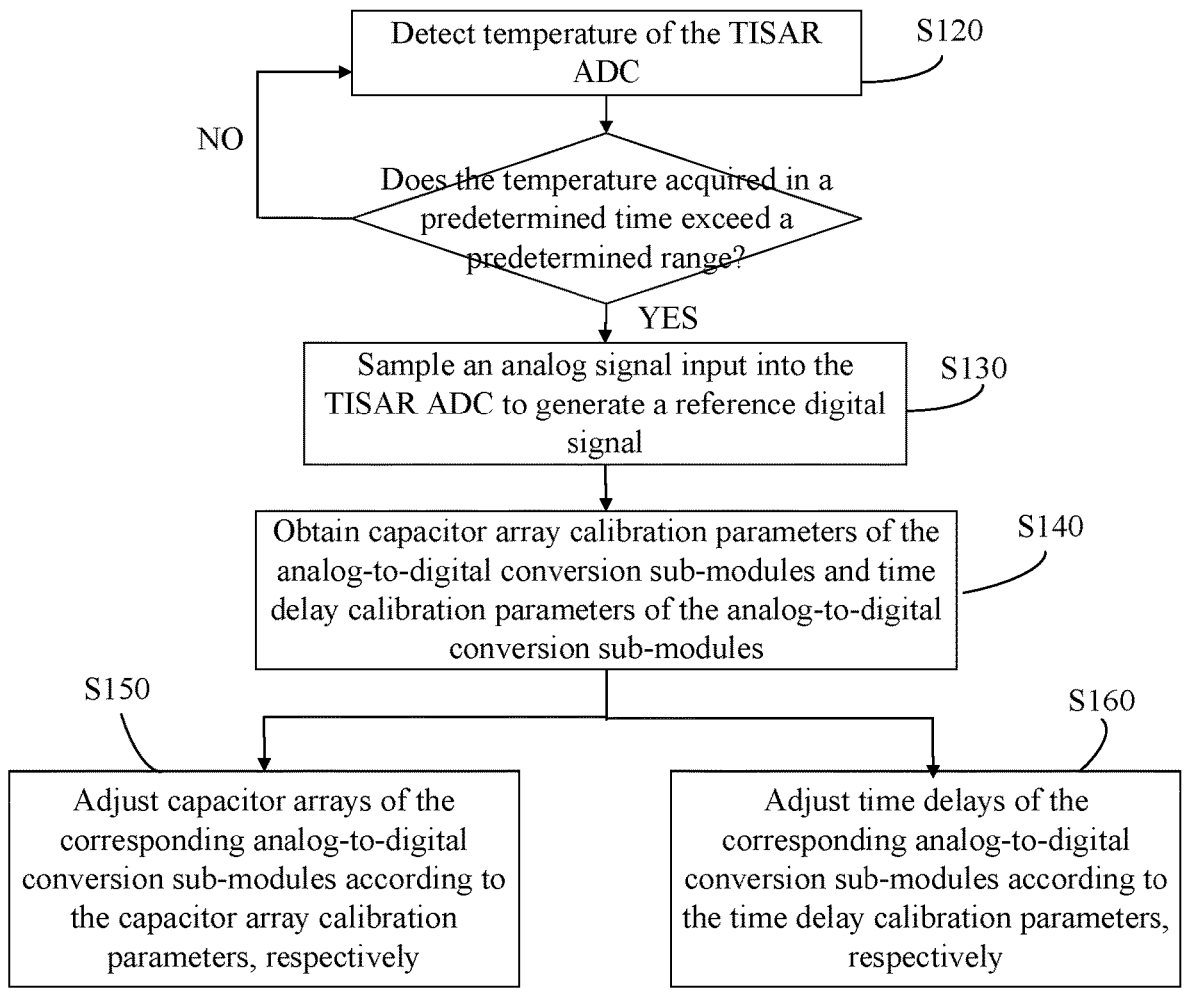
FIG. 8 is a flowchart of yet another implementation of the calibration method according to the present disclosure.

Since the temperature is an important factor affecting the delay of the integrated circuit, in the present disclosure, the change in temperature may be taken as a condition for activating the calibration method for a TISAR ADC according to the present disclosure. Correspondingly, in addition to the steps S130 to S160, the calibration method according to the present disclosure further includes step S120 prior to the step S130, as shown in FIG. 8.

At S120, the temperature of the TISAR ADC is detected.

In a case where the temperature acquired in a predetermined time exceeds a predetermined range, S130 and subsequent steps will be executed.

Figure 9:
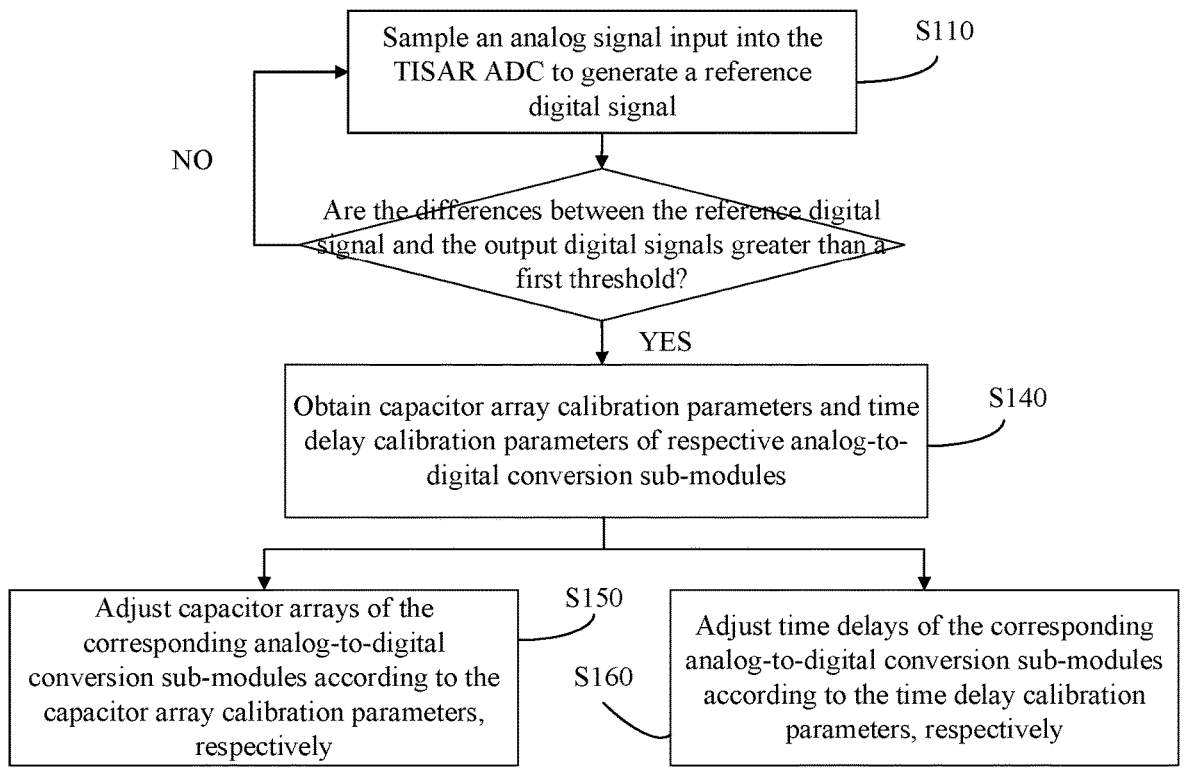
FIG. 9 is a flowchart of yet another implementation of the calibration method according to the present disclosure.

As another implementation of the present disclosure, the size of the error of the output digital signals of the TISAR ADC may also be taken as a condition for activating the calibration method according to the present disclosure, so that the calibration is activated in time when the errors of the output digital signals are greater than a first threshold. Correspondingly, in addition to steps S130 to S160, the calibration method according to the present disclosure further includes step S110 prior to S130, as shown in FIG. 9.

At S110, a determination is made as to whether the differences between the reference digital signal and the output digital signals of the TISAR ADC are greater than the first threshold.

In a case where the differences between the reference digital signal and the output digital signals of the TISAR ADC are greater than the first threshold, S130 and subsequent steps will be executed.

Figure 10:
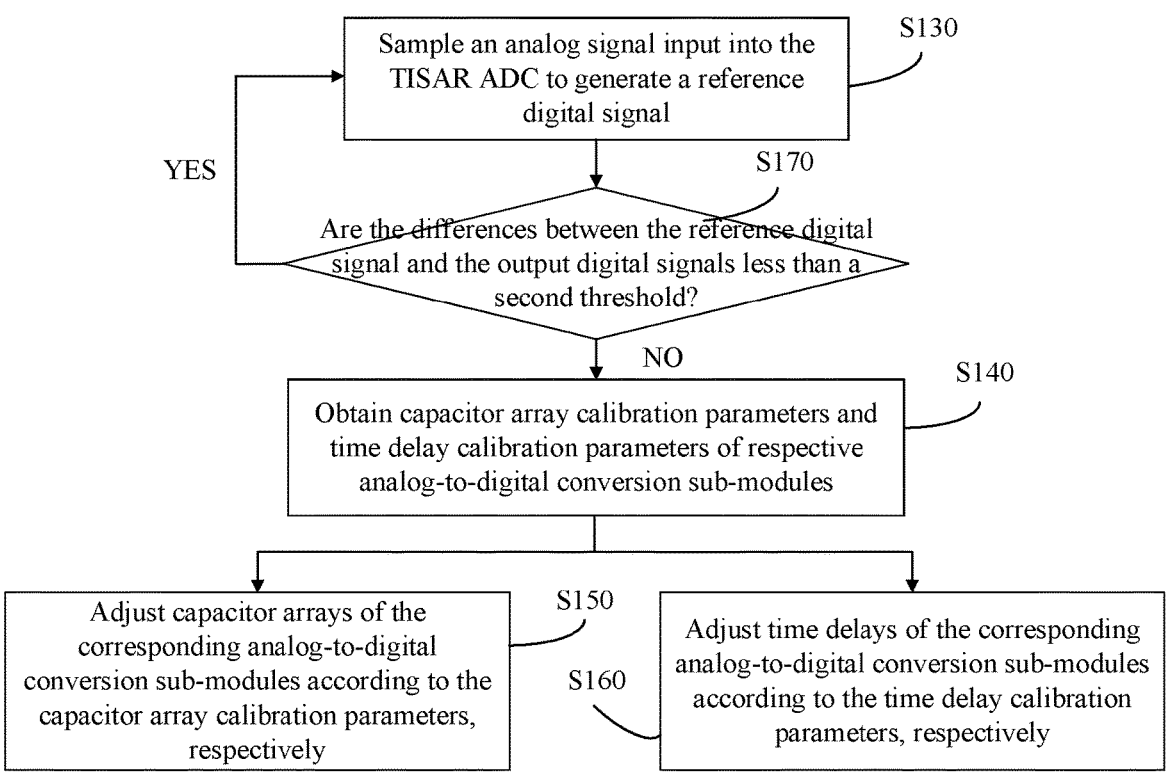
FIG. 10 is a flowchart of yet another implementation of the calibration method according to the present disclosure.

In the present disclosure, when the calibrated errors of the output digital signals of the TISAR ADC relative to the reference digital signal are less than a second threshold, the calibration of the TISAR ADC is completed, and the calibration method ends. Correspondingly, in addition to steps S130 to S160, the calibration method according to the present disclosure further includes step S170 after S130, as shown in FIG. 10.

At S170, a determination is made as to the differences between the reference digital signal and the output digital signals of the TISAR ADC are less than the second threshold.

In a case where the differences between the reference digital signal and the output digital signals of the TISAR ADC are less than the second threshold, S140 and subsequent steps will be stopped.

Figure 11:
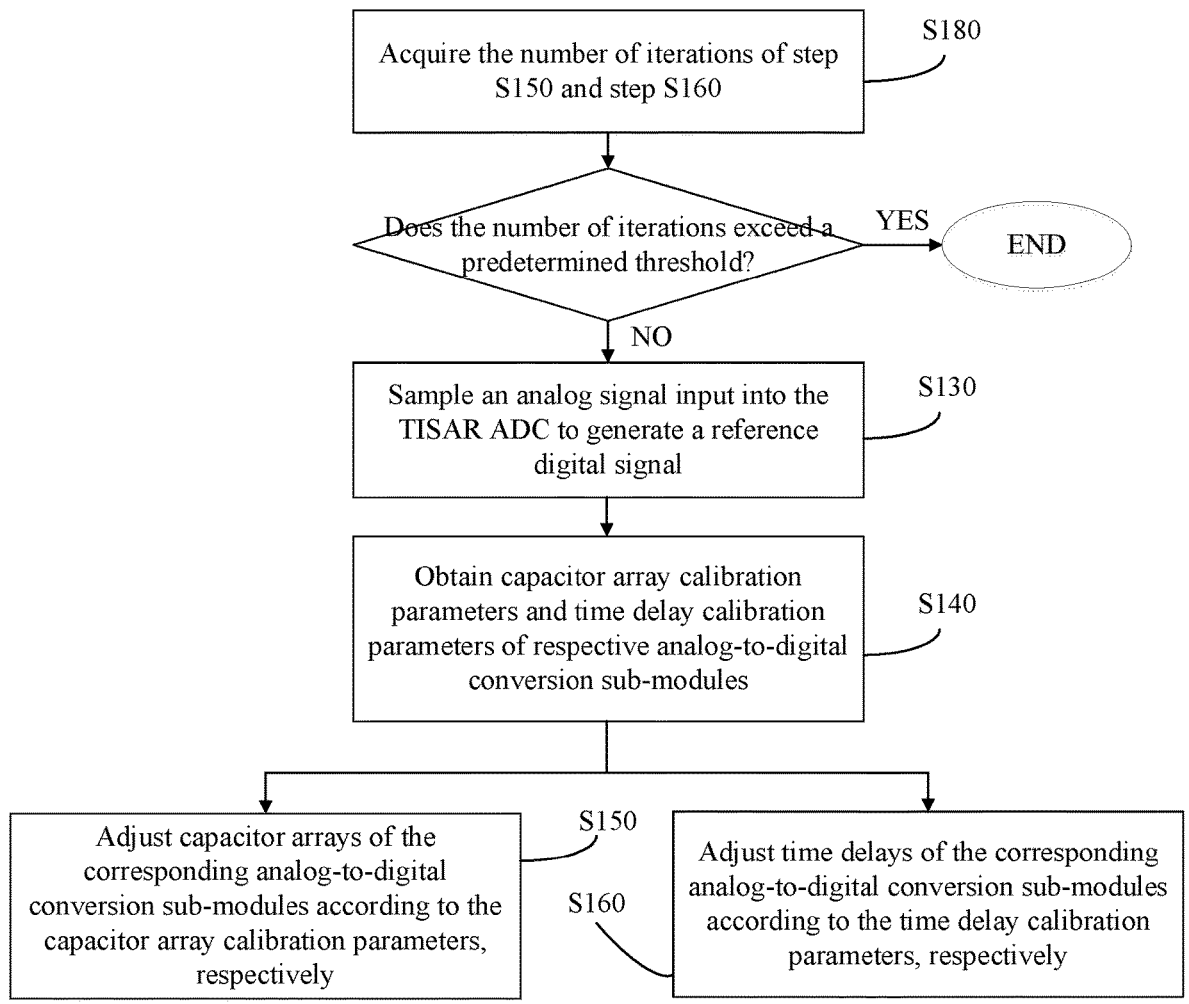
FIG. 11 is a flowchart of yet another implementation of the calibration method according to the present disclosure.

The calibration method according to the present disclosure is performed iteratively. Therefore, a determination can be made that the calibration of the TISAR ADC is completed when the number of iterations reaches a predetermined threshold, and the calibration method ends, thereby saving the calculation resources. Correspondingly, in addition to the steps S130 to S160, the calibration method according to the present disclosure further includes step S180 prior to S130, as shown in FIG. 11.

At S180, the number of iterations of S150 and S160 is acquired.

In a case where the number of iterations exceeds the predetermined threshold, the step S130 and subsequent steps will be stopped.

It is to be noted that, in practical applications, different steps in the calibration method according to the embodiments of the present disclosure may be combined to obtain new technical schemes, and these new technical schemes shall also fall into the protection scope of the present disclosure.

An embodiment of the calibration method according to the present disclosure will be given below.

By taking a two-channel TISAR ADC as an example, the two-channel TISAR ADC has a rate of 2 Gsps, and sub-ADCs adopt an SAR architecture and have a rate of 1 Gsps. The analog delay line corresponding to one digital code element has a step length of 75 fs, and the reference channel has a rate of 666.67 MHz.

A 389 MHZ monophonic signal is input. The two-channel time-interleaved SAR ADC is activated to sample the analog signal, and sampled data of the two-channel SAR ADC and the reference channel ADC are associated to obtain respective differences $e_{mk}$, k=1, 2, . . . , 200. When the amount of associated data reaches 200, $\varepsilon_m$ is calculated, and a step parameter of the SAR ADC is set as $u_1$=0.5. A new capacitor array error calibration parameter is obtained by iterations, and the capacitance weight of the SAR AC is updated to complete digital calibration and updating.

Square summation is performed on the obtained difference $e_{mk}$, k=1, 2, . . . , 200 to obtain $J'_m[n]$. The step parameter is set as $u_2$=1000, the digital code element $D_{m,n}$ at a current moment can be obtained by iterating the digital code element $D_{m,n-1}$ at a previous moment, and the analog delay line is adjusted by utilizing the digital code element $D_{m,n}$.

The above process is repeated until the number of iterations is 50 or $e_{m,k}^2$ is less than a given value 0.0001. At this time, the calibration is completed, and the calibrated output of the TISAR ADC can be obtained.

Figure 12:
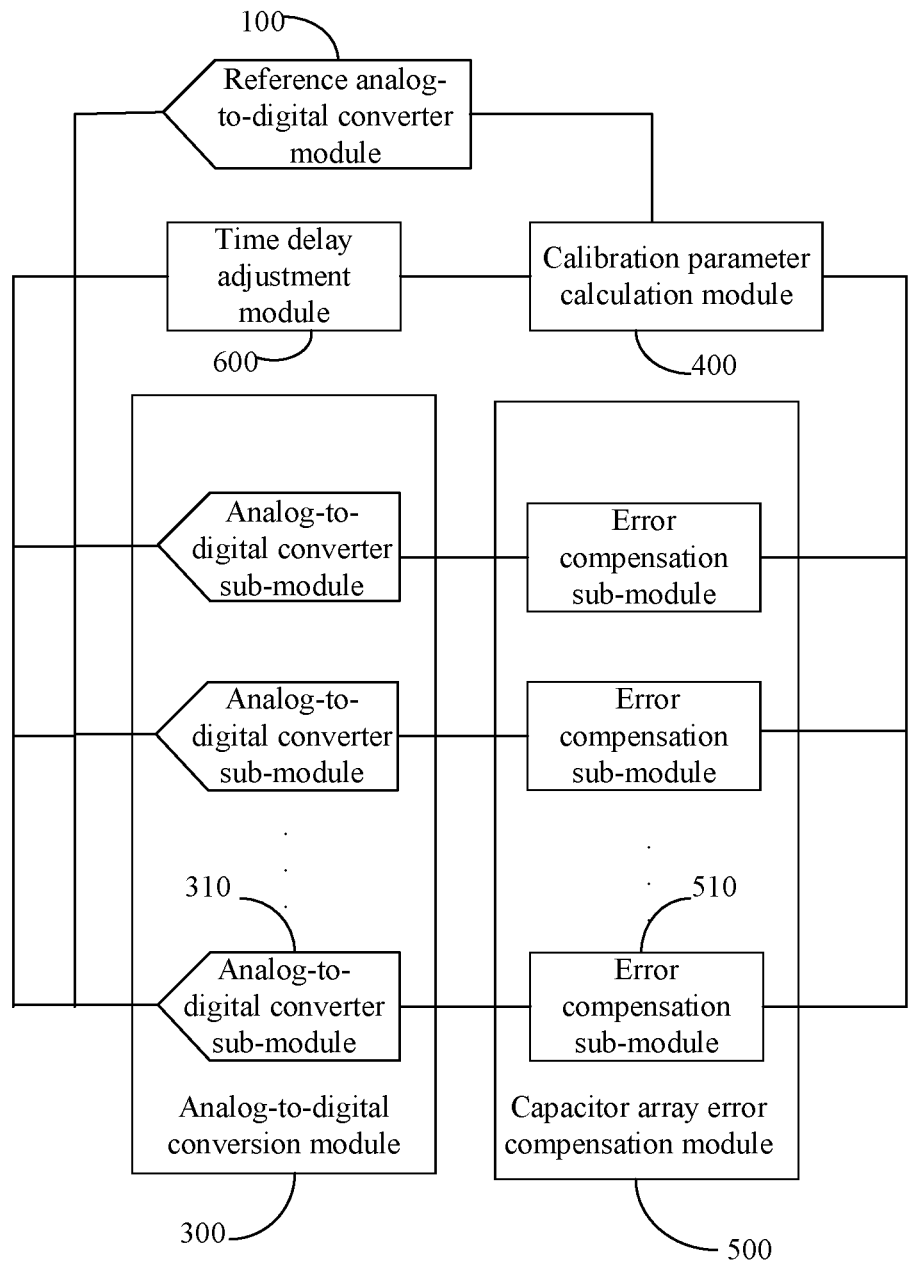
FIG. 12 is schematic structural diagram of a TISAR ADC according to the present disclosure.

According to another aspect of the present disclosure, a time-interleaved successive approximation register analog-to-digital converter (TISAR ADC) is provided. As shown in FIG. 12, the TISAR ADC includes an analog-to-digital conversion module 300, reference analog-to-digital convertor module 100, a calibration parameter calculation module 400, a capacitor array error compensation module 500 and a time delay adjustment module 600.

The analog-to-digital conversion module 300 includes a plurality of analog-to-digital conversion sub-modules 310. The plurality of analog-to-digital conversion sub-modules 310 are configured to perform time-interleaved sampling on an analog signal input into the TISAR ADC, and each of the analog-to-digital conversion sub-modules 310 is able to generate an output digital signal.

The reference analog-to-digital convertor module 100 is configured to sample the analog signal to generate a reference digital signal.

The calibration parameter calculation module 400 is configured to obtain, according to the reference digital signal generated by the reference analog-to-digital convertor module 100 and the output digital signals generated by the analog-to-digital conversion sub-modules 310, capacitor array calibration parameters of the analog-to-digital conversion sub-modules 310 and time delay calibration parameters of the analog-to-digital conversion sub-modules 310.

The capacitor array error compensation module 500 includes a plurality of error compensation sub-modules 510. The number of the error compensation sub-modules 510 is the same as the number of the analog-to-digital conversion sub-modules 310. The error compensation sub-modules 510 are in one-to-one correspondence to the analog-to-digital conversion sub-modules 310. The capacitor array error compensation sub-modules 510 are configured to adjust capacitor arrays of the corresponding analog-to-digital conversion sub-modules 310 according to the capacitor array calibration parameters of the analog-to-digital conversion sub-modules 310.

The time delay adjustment module 600 includes a plurality of analog delay line sub-modules. The number of the analog delay line sub-modules is the same as the number of analog-to-digital conversion sub-modules 310. The analog delay line sub-modules are in one-to-one correspondence to the analog-to-digital conversion sub-modules 310. The analog delay line sub-modules are configured to adjust time delays of the corresponding analog-to-digital conversion sub-modules 310 according to the time delay calibration parameters of the analog-to-digital conversion sub-modules 310.

It is to be noted that, in the present disclosure, the capacitor array error compensation module 500 is specifically a CDAC, i.e., a capacitor-type digital-to-analog conversion structure.

In the time-interleaved successive approximation register analog-to-digital converter (TISAR ADC) according to the present disclosure, by configuring the reference analog-to-digital convertor module 100, the reference digital signal generated by the reference analog-to-digital convertor module 100 is compared with the output digital signals generated by the analog-to-digital conversion sub-modules 310 of the TISAR ADC to obtain errors of the output digital signals of the analog-to-digital conversion sub-modules 310. The calibration parameter calculation module 400 calculates capacitor array calibration parameters of the analog-to-digital conversion sub-modules 310 by utilizing the errors, and the capacitor array error compensation module 500 calibrates the capacitor array errors of the analog-to-digital conversion sub-modules 310 by utilizing the capacitor array calibration parameters. Meanwhile, the calibration parameter calculation module 400 calculate time delay calibration parameters of the analog-to-digital conversion sub-modules 310, and the time delay adjustment module 600 calibrate the time delay errors of the analog-to-digital conversion sub-modules 310 by utilizing the time delay calibration parameters. Thus, the capacitor array errors and time errors in the TISAR ADC are jointly calibrated, and the mutual influence of capacitor array errors and time errors is reduced. In addition, when the calibration parameter calculation module 400 calculates the capacitor array calibration parameters and time delay calibration parameters of the analog-to-digital conversion sub-modules 310, the errors of the output digital signals of the analog-to-digital conversion sub-modules 310 only needs to be calculated for one time, so that the consumption of calculation resources can be decreased and the hardware circuit of the TISAR ADC can also be simplified.

Figure 13:
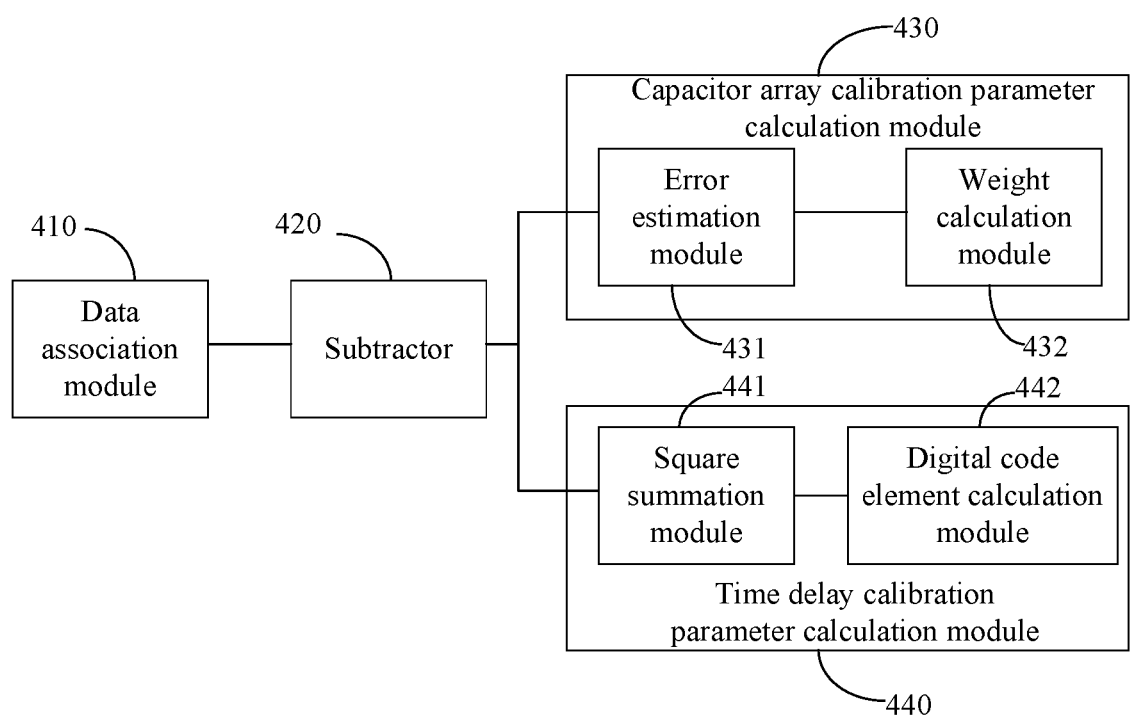
FIG. 13 is a schematic diagram of a calibration parameter calculation module in the TISAR ADC according to the present disclosure.

In some embodiments, as shown in FIG. 13, the calibration parameter calculation module 400 includes a subtractor 420, a capacitor array calibration parameter calculation module 430 and a time delay calibration parameter calculation module 440.

The subtractor 420 is configured to calculate differences between the numerical values of the output digital signals generated by the analog-to-digital conversion sub-modules 310 and the numerical value of the reference digital signal at the corresponding sampling moment, respectively.

The capacitor array calibration parameter calculation module 430 is configured to calculate, according to the differences calculated by the subtractor 420, capacitor array calibration parameters of the analog-to-digital conversion sub-modules 310, respectively.

The time delay calibration parameter calculation module 440 is configured to calculate, according to the differences calculated by the subtractor 420, time delay calibration parameters of the analog-to-digital conversion sub-modules 310, respectively.

In some embodiments, as shown in FIG. 13, the capacitor array calibration parameter calculation module 430 includes an error estimation module 431 and a weight calculation module 432.

The error estimation module 431 is configured to calculate, according to the differences calculated by the subtractor 420, weight errors of capacitor arrays of the analog-to-digital conversion sub-modules 310, respectively.

The weight calculation module 432 is configured to calculate, according to the weight errors calculated by the error estimation module 431, calibration weights of capacitor arrays of the corresponding analog-to-digital conversion sub-modules 310, and use the calibration weights as capacitor array calibration parameters of the analog-to-digital conversion sub-modules 310.

In some embodiments, as shown in FIG. 13, the time delay parameter calculation module 440 includes a square summation module 441 and a digital control code calculate module 442.

The square summation module 441 is configured to calculate the sum of squares of the differences corresponding to different sampling moments of each of the analog-to-digital conversion sub-modules 310.

The digital control code calculate module 442 is configured to, for each of the analog-to-digital conversion sub-modules 310, calculate, according to the sum of squares calculated by the square summation module, a corresponding analog delay line digital control code of the analog-to-digital conversion sub-module 310, and use the analog delay line digital control code as a time delay calibration parameter of the analog-to-digital conversion sub-module 310.

In some embodiments, the TISAR ADC further includes a temperature sensor.

The temperature sensor is configured to detect the temperature of the TISAR ADC and generate a temperature signal.

The reference analog-to-digital convertor module 100 is configured to receive the temperature signal generated by the temperature signal and configured to, in the case that the temperature acquired in a predetermined time exceeds a predetermined range, sample the analog signal input into the TISAR ADC to generate the reference digital signal.

In some embodiments, the calibration parameter calculation module 400 is configured to determine whether the differences between the reference digital signal generated by the reference analog-to-digital converter module 100 and the output digital signals of the TISAR ADC are greater than a first threshold, and configured to, in the case that the differences between the reference digital signal and the output digital signals of the TISAR ADC are greater than the first threshold, obtain capacitor array calibration parameters of the analog-to-digital conversion sub-modules 310 and time delay calibration parameters of the analog-to-digital conversion sub-modules 310 according to the reference digital signal and the output digital signals generated by the analog-to-digital conversion sub-modules 310 of the TISAR ADC.

In some embodiments, the calibration parameter calculation module 400 is configured to determine whether the differences between the reference digital signal generated by the reference analog-to-digital converter module and the output digital signals of the TISAR ADC are less than a second threshold, and configured to, in the case that the differences between the reference digital signal and the output digital signals of the TISAR ADC are less than the second threshold, stop obtaining capacitor array calibration parameters of the analog-to-digital conversion sub-modules 310 and time delay calibration parameters of the analog-to-digital conversion sub-modules 310 according to the reference digital signal and the output digital signals generated by the analog-to-digital conversion sub-modules 310 of the TISAR ADC.

In some embodiments, the TISAR ADC includes a counting module.

The counting module is configured to acquire the number of iterations of adjusting, by the capacitor array error compensation module, capacitor arrays of the corresponding analog-to-digital conversion sub-modules according to the capacitor array calibration parameters of the analog-to-digital conversion sub-modules respectively and adjusting, by the time delay adjustment module, time delays of the corresponding analog-to-digital conversion sub-modules according to the time delay calibration parameters of the analog-to-digital conversion sub-modules respectively.

The reference analog-to-digital converter module 100 is configured to, in the case that the number of iterations exceeds a predetermined threshold, stop sampling the analog signal input into the TISAR ADC.

In the present disclosure, the errors of the output digital signals of the analog-to-digital conversion sub-modules are obtained by comparing the reference digital signal with the output digital signals generated by the analog-to-digital conversion sub-modules of the TISAR ADC. By utilizing the errors, the capacitor array calibration parameters of the analog-to-digital conversion sub-modules are calculated for calibrating the capacitor array errors of the TISAR ADC, and the time delay calibration parameters of the analog-to-digital conversion sub-modules are calculated for calibrating the time errors of the TISAR ADC. Accordingly, the capacitor array errors and time errors in the TISAR ADC are jointly calibrated, and the mutual influence of capacitor array errors and time errors is reduced. In addition, during the calibration of the capacitor array calibration parameters and time delay calibration parameters of the analog-to-digital conversion sub-modules, the errors of the output digital signals of the analog-to-digital conversion sub-modules do not need to be calculated repeatedly, so that the consumption of calculation resources can be decreased and the design requirement for the hardware circuit of the TISAR ADC can be reduced.

It should be understood that, the foregoing implementations are merely exemplary implementations for describing the principle of the present disclosure, and the present disclosure is not limited thereto. A person having ordinary skill in the art can make various variations and improvements without departing from the scope and essence of the present disclosure, and these variations and improvements shall fall into the protection scope of the present disclosure.

What is claimed is:

1. A calibration method for a Time-Interleaved Successive Approximation Register Analog-to-Digital Converter, TISAR ADC, comprising:
    sampling an analog signal input into the TISAR ADC to generate a reference digital signal;
    calculating differences between numerical values of the output digital signals generated by the analog-to-digital conversion sub-modules and a numerical value of the reference digital signal at corresponding sampling moment, respectively;
    calculating, according to the calculated differences, the capacitor array calibration parameters of the analog-to-digital conversion sub-modules, respectively;
    calculating, according to the calculated differences, the time delay calibration parameters of the analog-to-digital conversion sub-modules, respectively;
    adjusting capacitor arrays of the corresponding analog-to-digital conversion sub-modules according to the capacitor array calibration parameters, respectively; and
    adjusting time delays of the corresponding analog-to-digital conversion sub-modules according to the time delay calibration parameters, respectively;
        wherein, calculating, according to the calculated differences, the time delay calibration parameters of the analog-to-digital conversion sub-modules respectively comprises:
            calculating a sum of squares of the differences corresponding to different sampling moments of each of the analog-to-digital conversion sub-modules, respectively; and
            for each of the analog-to-digital conversion sub-modules, calculating, according to the sum of squares, an analog delay line digital control code of the corresponding analog-to-digital conversion sub-module, and using the analog delay line digital control code as a time delay calibration parameter of the analog-to-digital conversion sub-module.

2. The calibration method of claim 1, wherein, calculating, according to the calculated differences, the capacitor array calibration parameters of the analog-to-digital conversion sub-modules respectively comprises:
    calculating, according to the differences, weight errors of the capacitor arrays of the analog-to-digital conversion sub-modules, respectively; and
    calculating, according to the weight errors, calibration weights of the capacitor arrays of the corresponding analog-to-digital conversion sub-modules, and using the calibration weights as the capacitor array calibration parameters of the analog-to-digital conversion sub-modules.

3. The calibration method of claim 1, prior to sampling an analog signal input into the TISAR ADC to generate a reference digital signal, further comprising:
    detecting temperature of the TISAR ADC; and
    in response to the temperature acquired in a predetermined time exceeding a predetermined range, executing the step of sampling an analog signal input into the TISAR ADC to generate a reference digital signal.

4. The calibration method of claim 1, after sampling an analog signal input into the TISAR ADC to generate a reference digital signal, further comprising:
determining whether the differences between the reference digital signal and the output digital signals of the TISAR ADC are greater than a first threshold; and
in response to the differences between the reference digital signal and the output digital signals of the TISAR ADC being greater than the first threshold, executing the step of according to the reference digital signal and output digital signals generated by analog-to-digital conversion sub-modules of the TISAR ADC, obtaining capacitor array calibration parameters and time delay calibration parameters of the analog-to-digital conversion sub-modules.

5. The calibration method of claim 1, after sampling an analog signal input into the TISAR ADC to generate a reference digital signal, further comprising:
determining whether the differences between the reference digital signal and the output digital signals of the TISAR ADC are less than a second threshold; and
in response to the differences between the reference digital signal and the output digital signals of the TISAR ADC being less than the second threshold, stopping executing the step of according to the reference digital signal and output digital signals generated by analog-to-digital conversion sub-modules of the TISAR ADC, obtaining capacitor array calibration parameters of the analog-to-digital conversion sub-modules and time delay calibration parameters of the analog-to-digital conversion sub-modules.

6. The calibration method of claim 1, prior to sampling an analog signal input into the TISAR ADC to generate a reference digital signal, further comprising:
acquiring a number of iterations of the step of adjusting capacitor arrays of the corresponding analog-to-digital conversion sub-modules according to the capacitor array calibration parameters respectively and the step of adjusting time delays of the corresponding analog-to-digital conversion sub-modules according to the time delay calibration parameters respectively; and
in response to the number of iterations exceeding a predetermined threshold, stopping executing the step of sampling an analog signal input into the TISAR ADC to generate a reference digital signal.

7. A Time-Interleaved Successive Approximation Register Analog-to-Digital Converter, TISAR ADC, comprising:
an analog-to-digital conversion module, comprising a plurality of analog-to-digital conversion sub-modules, wherein the plurality of analog-to-digital conversion sub-modules are configured to perform time-interleaved sampling on an analog signal input into the TISAR ADC, each of the analog-to-digital conversion sub-modules is able to generate an output digital signal;
a reference analog-to-digital convertor module, configured to sample the analog signal to generate a reference digital signal;
a calibration parameter calculation module, configured to obtain, according to the reference digital signal generated by the reference analog-to-digital convertor module and the output digital signals generated by the analog-to-digital conversion sub-modules, capacitor array calibration parameters of the analog-to-digital conversion sub-modules and time delay calibration parameters of the analog-to-digital conversion sub-modules;
a capacitor array error compensation module, comprising a plurality of error compensation sub-modules, wherein the number of the error compensation sub-modules is the same as the number of the analog-to-digital conversion sub-modules, the error compensation sub-modules are in one-to-one correspondence to the analog-to-digital conversion sub-modules, the capacitor array error compensation sub-modules are configured to adjust capacitor arrays of the corresponding analog-to-digital conversion sub-modules according to the capacitor array calibration parameters of the analog-to-digital conversion sub-modules; and
a time delay adjustment module, comprising a plurality of analog delay line sub-modules, wherein the number of the analog delay line sub-modules is the same as the number of analog-to-digital conversion sub-modules, the analog delay line sub-modules are in one-to-one correspondence to the analog-to-digital conversion sub-modules, the analog delay line sub-modules are configured to adjust time delays of the corresponding analog-to-digital conversion sub-modules according to the time delay calibration parameters of the analog-to-digital conversion sub-modules,
wherein the calibration parameter calculation module comprises:
a subtractor, configured to calculate differences between the numerical values of the output digital signals generated by the analog-to-digital conversion sub-modules and the numerical value of the reference digital signal at a corresponding sampling moment, respectively;
a capacitor array calibration parameter calculation module, configured to calculate, according to the differences calculated by the subtractor, capacitor array calibration parameters of the analog-to-digital conversion sub-modules, respectively; and
a time delay calibration parameter calculation module, configured to calculate, according to the differences calculated by the subtractor, time delay calibration parameters of the analog-to-digital conversion sub-modules, respectively, wherein the time delay calibration parameter calculation module comprises:
a square summation module, configured to calculate the sum of squares of the differences corresponding to different sampling moments of each of the analog-to-digital conversion sub-modules; and
a digital control code calculate module, configured to, for each of the analog-to-digital conversion sub-modules, calculate, according to the sum of squares calculated by the square summation module, an analog delay line digital control code of the corresponding analog-to-digital conversion sub-module, and use the analog delay line digital control code as a time delay calibration parameter of the analog-to-digital conversion sub-module.

8. The TISAR ADC of claim 7, wherein the capacitor array calibration parameter calculation module comprises:
an error estimation module, configured to calculate, according to the differences calculated by the subtractor, weight errors of capacitor arrays of the analog-to-digital conversion sub-modules, respectively; and a weight calculation module, configured to calculate, according to the weight errors calculated by the error estimation module, calibration weights of capacitor arrays of the corresponding analog-to-digital conversion sub-modules, and use the calibration weights as capacitor array calibration parameters of the analog-to-digital conversion sub-modules.

9. The TISAR ADC of claim 7, comprising:

a temperature sensor, configured to detect the temperature of the TISAR ADC and generate a temperature signal; and the reference analog-to-digital convertor module, is configured to receive the temperature signal generated by the temperature sensor and configured to, in response to the temperature acquired in a predetermined time exceeding a predetermined range, sample the analog signal input into the TISAR ADC to generate the reference digital signal.

10. The TISAR ADC of claim 7, wherein, the calibration parameter calculation module is configured to determine whether the differences between the reference digital signal generated by the reference analog-to-digital converter module and the output digital signals of the TISAR ADC are greater than a first threshold, and configured to, in response to the differences between the reference digital signal and the output digital signals of the TISAR ADC being greater than the first threshold, obtain capacitor array calibration parameters of the analog-to-digital conversion sub-modules and time delay calibration parameters of the analog-to-digital conversion sub-modules according to the reference digital signal and the output digital signals generated by the analog-to-digital conversion sub-modules of the TISAR ADC.

11. The TISAR ADC of claim 7, wherein, the calibration parameter calculation module is configured to determine whether the differences between the reference digital signal generated by the reference analog-to-digital converter module and the output digital signals of the TISAR ADC are less than a second threshold, and configured to, in response to the differences between the reference digital signal and the output digital signals of the TISAR ADC being less than the second threshold, stop obtaining capacitor array calibration parameters of the analog-to-digital conversion sub-modules and time delay calibration parameters of the analog-to-digital conversion sub-modules according to the reference digital signal and the output digital signals generated by the analog-to-digital conversion sub-modules of the TISAR ADC.

12. The TISAR ADC of claim 7, comprising:

a counting module, configured to acquire a number of iterations of adjusting, by the capacitor array error compensation module, capacitor arrays of the corresponding analog-to-digital conversion sub-modules according to the capacitor array calibration parameters of the analog-to-digital conversion sub-modules respectively and adjusting, by the time delay adjustment module, time delays of the corresponding analog-to-digital conversion sub-modules according to the time delay calibration parameters of the analog-to-digital conversion sub-modules respectively; and wherein the reference analog-to-digital converter module is configured to, in response to the number of iterations exceeding a predetermined threshold, stop sampling the analog signal input into the TISAR ADC.

* * * * *